(12) United States Patent
Ahn et al.

(10) Patent No.: US 8,547,721 B2
(45) Date of Patent: Oct. 1, 2013

(54) RESISTIVE MEMORY DEVICE

(75) Inventors: Seungeon Ahn, Suwon-si (KR); Kihwan Kim, Anyang-si (KR); Changjung Kim, Yongin-si (KR); Myungjae Lee, Suwon-si (KR); Bosoo Kang, Seoul (KR); Changbum Lee, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 577 days.

(21) Appl. No.: 12/385,566

(22) Filed: Apr. 13, 2009

(65) Prior Publication Data
US 2010/0090187 A1    Apr. 15, 2010

(30) Foreign Application Priority Data

Oct. 13, 2008 (KR) .................. 10-2008-0100195

(51) Int. Cl.
| | | |
|---|---|---|
| G11C 5/06 | (2006.01) | |
| G11C 5/02 | (2006.01) | |
| G11C 11/21 | (2006.01) | |
| H01L 29/00 | (2006.01) | |
| H01L 47/00 | (2006.01) | |

(52) U.S. Cl.
USPC ............. 365/63; 365/148; 365/51; 365/72; 365/242; 365/243; 365/175; 257/1; 257/2; 257/3; 257/4; 257/5; 257/E45.001; 257/E45.002; 257/E45.003; 257/43

(58) Field of Classification Search
USPC .............. 257/1–5, 43, E45.001, E45.002, 257/E45.003; 365/148, 51, 63, 72, 175, 158, 365/242, 243, 163
See application file for complete search history.

(56) References Cited

U.S. PATENT DOCUMENTS

| | | | |
|---|---|---|---|
| 6,813,182 B2 | 11/2004 | Perlov et al. | |
| 2001/0026470 A1* | 10/2001 | Gillies et al. | 365/158 |
| 2003/0183849 A1* | 10/2003 | Fricke et al. | 257/200 |
| 2003/0183867 A1* | 10/2003 | Fricke et al. | 257/314 |
| 2003/0183868 A1 | 10/2003 | Fricke et al. | |

FOREIGN PATENT DOCUMENTS
| | | |
|---|---|---|
| JP | 2006-203098 | 8/2006 |
| KR | 1020040104967 | 12/2004 |
| KR | 1020060087882 | 8/2006 |

OTHER PUBLICATIONS

Lee M J, Park Y, Kang B S, et al. 2-stack 1D-1R cross-point structure with oxide diodes as switch elements for high density resistance RAM applications. IEDM Tech Dig, Washington D C, USA, 2007.*

* cited by examiner

Primary Examiner — J. H. Hur
(74) Attorney, Agent, or Firm — Harness, Dickey & Pierce

(57) ABSTRACT

Disclosed is a resistive memory device. In the resistive memory device, at least one variable resistance region and at least one switching device may be horizontally apart from each other, rather than being disposed on the same vertical axis. At least one intermediate electrode, which electrically connects the at least one variable resistance region and the at least one switching device, may be between the at least one variable resistance region and the at least one switching device.

24 Claims, 10 Drawing Sheets

RESISTIVE MEMORY DEVICE

CROSS REFERENCE TO RELATED APPLICATIONS

This application claims priority under 35 U.S.C. §119 to Korean Patent Application No. 10-2008-0100195, filed on Oct. 13, 2008, in the Korean Intellectual Property Office (KIPO), the entire contents of which are incorporated herein by reference.

BACKGROUND

1. Field

Example embodiments relate to a resistive memory device.

2. Description of the Related Art

A resistive memory device is a non-volatile memory device using resistance changing characteristics of a material, e.g., a metal oxide, of which resistance is changed significantly at a particular voltage level. In other words, the resistance of the variable resistance material decreases when a voltage exceeding a set voltage is applied thereto. This state is referred to as an ON state. When a voltage exceeding a reset voltage is applied to the variable resistance material, the resistance thereof increases. This state is referred as an OFF state. Among resistive memory devices, a multi-layer cross point memory device is advantageous for improving integration.

Generally, a resistive memory device includes a storage node, which includes a variable resistance layer, and a switching device electrically connected to the storage node. The switching device controls signal access to the storage node. In resistive memory devices in the related art, switching devices may be damaged during programming operations. Thus, the reliability of memory devices may be deteriorated, and improved integration of the memory devices may be difficult.

SUMMARY

Example embodiments include a resistive memory device which uses a variable resistance layer as an element for storing information. Additional aspects will be set forth in part in the description which follows and, in part, will be apparent from the description, or may be learned by practice of example embodiments.

According to example embodiments, a resistive memory device may include a first electrode; a second electrode apart from the first electrode; and a first laminated structure between the first and second electrodes and including a first variable resistance layer, a first switching device, and a first intermediate electrode therebetween, wherein the first variable resistance layer includes a first variable resistance region, which is a effective variable resistance region, and the first variable resistance region and the first switching device are horizontally apart from each other.

The first variable resistance region may be between the first electrode and the first intermediate electrode, and the first switching device may be between the first intermediate electrode and the second electrode. In example embodiments, an insulation layer having a hole which exposes a portion of the first electrode may further be on the first electrode, and the first variable resistance layer may contact the portion of the first electrode exposed in the hole.

The first switching device may be between the first electrode and the first intermediate electrode, and the first variable resistance region is between the first intermediate electrode and the second electrode. In example embodiments, an insulation layer having a hole which exposes a portion of the first intermediate electrode may further be on the first intermediate electrode, and the first variable resistance layer may contact the portion of the first intermediate electrode exposed in the hole. The first intermediate electrode may either include a stepped portion or be parallel to a substrate.

If the first intermediate electrode includes a stepped portion, the first variable resistance region and the first switching device may be on both ends of the stepped portion. The first variable resistance layer may include a metal oxide. The metal oxide may include at least one of Ni oxide, Cu oxide, Ti oxide, Co oxide, Hf oxide, Zr oxide, Zn oxide, W oxide, Nb oxide, TiNi oxide, LiNi oxide, Al oxide, InZn oxide, V oxide, SrZr oxide, SrTi oxide, Cr oxide, Fe oxide, Ta oxide, and compounds thereof.

The first switching device may be one from among a diode, a threshold switching device, and a varistor. The first switching device may be an oxide diode. A plurality of the first electrodes having a shape of a wiring and arranged in parallel to each other, a plurality of the second electrodes having a shape of a wiring may be arranged parallel to each other to cross the plurality of first electrodes, and the first laminated structure may be on each intersection point of the plurality of first and second electrodes.

The resistive memory device may further include a third electrode located vertically apart from the second electrode, and may further include a second laminated structure between the second and third electrodes and including a second variable resistance layer, a second switching device, and a second intermediate electrode therebetween, wherein the second variable resistance layer may include a second variable resistance region, which is an effective variable resistance region, and the second variable resistance region and the second switching device may be horizontally apart from each other.

The second switching device may be between the second electrode and the second intermediate electrode, and the second variable resistance region may be between the second intermediate electrode and the third electrode. In example embodiments, the second switching device may be above the first switching device.

The second variable resistance region may be between the second electrode and the second intermediate electrode, and the second switching device may be between the second intermediate electrode and the third electrode. The second intermediate electrode may either include a stepped portion or be parallel to a substrate.

If the second intermediate electrode includes a stepped portion, the second variable resistance region and the second switching device may be on both ends of the stepped portion. The second variable resistance layer may be formed of the same material as the first variable resistance layer. The second switching device may be one from among a diode, a threshold switching device, and a varistor. The second switching device may be an oxide diode. In case where the plurality of first and second switching devices are diodes, directions of rectification of the plurality of first and second switching devices may be either the same or opposite from each other.

A plurality of the second electrodes having a shape of wiring may be arranged parallel to each other, a plurality of the third electrodes having a shape of a wiring may be arranged parallel to each other to cross the plurality of second electrodes, and the second laminated structure may be on each of an intersection point of the plurality of second and third electrodes. The resistive memory device may be a multi-layer cross-point memory device having a 1S(switch)-1R (resistor) cell structure.

BRIEF DESCRIPTION OF THE DRAWINGS

Example embodiments will be more clearly understood from the following detailed description taken in conjunction with the accompanying drawings. FIGS. 1-4 and 6-11 represent non-limiting, example embodiments as described herein.

FIGS. 1 and 2 are oblique views of resistive memory devices according to example embodiments;

FIGS. 3 and 4 are sectional views of resistive memory devices according to example embodiments;

FIG. 6 is a graph showing voltage (V)-current (A) characteristics of a resistive memory device according to example embodiments;

FIGS. 7 and 8 are oblique views of resistive memory devices having array structures according to example embodiments;

FIG. 10 is an oblique view of a resistive memory device having an array structure according to example embodiments; and FIG. 11 is a sectional view of a resistive memory device having an array structure according to example embodiments.

Figure 1:
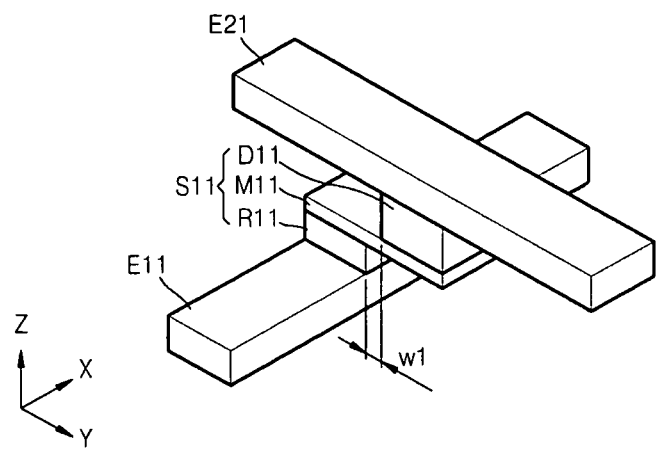

It should be noted that these Figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF EXAMPLE EMBODIMENTS

Various example embodiments will now be described more fully with reference to the accompanying drawings in which some example embodiments are shown. Detailed illustrative example embodiments are disclosed herein. However, specific structural and functional details disclosed herein are merely representative for purposes of describing example embodiments. Example embodiments may, however, may be embodied in many alternate forms and should not be construed as limited to only example embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but on the contrary, example embodiments are to cover all modifications, equivalents, and alternatives falling within the scope of example embodiments. Like numbers refer to like elements throughout the description of the figures.

It will be understood that, although the terms first, second, etc., may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or," includes any and all combinations of one or more of the associated listed items.

It will be understood that when an element or layer is referred to as being "formed on," another element or layer, it can be directly or indirectly formed on the other element or layer. That is, for example, intervening elements or layers may be present. In contrast, when an element or layer is referred to as being "directly formed on," to another element, there are no intervening elements or layers present. Other words used to describe the relationship between elements or layers should be interpreted in a like fashion (e.g., "between," versus "directly between," "adjacent," versus "directly adjacent," etc.).

The terminology used herein is for the purpose of describing particular embodiments only and is not intended to be limiting of example embodiments. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

Reference will now be made in detail to embodiments, examples of which are illustrated in the accompanying drawings. In the drawings, the thicknesses of layers and regions are exaggerated for clarity. Like reference numerals in the drawings denote like elements. In this regard, example embodiments may have different forms and should not be construed as being limited to the descriptions set forth herein. Accordingly, example embodiments are merely described below, by referring to the figures, to explain aspects of the present description.

FIG. 1 is an oblique view of a resistive memory device according to example embodiments. Referring to FIG. 1, a first electrode E11 may be disposed on a substrate (not shown). The substrate may be a glass substrate, a hard plastic substrate, a flexible plastic substrate and/or a silicon substrate. The first electrode E11 may have a shape of a wiring extending in a predetermined or given direction, e.g., the direction of the X-axis. A second electrode E21 may be formed above the first electrode E11. The second electrode E21 may have a wiring shape crossing the first electrode E11. For example, the second electrode E21 may extend in the direction of the Y-axis and perpendicularly cross the first electrode E11.

However, the directions in which the first and second electrodes E11 and E21 respectively extend may be reversed, and shapes of the first and second electrodes E11 and E21 may vary. The first and second electrodes E11 and E21 may be formed of materials generally used for forming electrodes in the semiconductor device industry, and may be formed to have either single-layer structure or multi-layer structure. Materials for the first and second electrodes E11 and E21 may be either equal to or different from each other.

A laminated structure S11 may be interposed between the first and second electrodes E11 and E21. Where the first and second electrodes E11 and E21 have shapes of wiring crossing each other, the laminated structure S11 may be disposed at the intersection point of the first and second electrodes E11 and E21. The laminated structure S11 may include a variable resistance layer R11, a switching device D11, and an intermediate electrode M11 between the variable resistance layer R11 and the switching device D11. The variable resistance layer R11 may contact one of the first and second electrodes E11 and E21, e.g., the first electrode E11. The switching device D11 may contact the other one of the first and second electrodes E11 and E21, e.g., the second electrode E21.

In example embodiments, a contact electrode layer (not shown) may be further interposed between the switching device D11 and the second electrode E21. The variable resistance layer R11 and the switching device D11 may not be disposed at a same vertical line, and may be disposed horizontally apart from each other. For example, the center of the variable resistance layer R11 and the center of the switching device D11 may be apart from each other in the direction of the Y-axis. When viewed from above, if the minimum distance between the variable resistance layer R11 and the switching device D1 is referred to as an interval w1, the interval w1 may be either zero or greater than zero. The variable resistance layer R11 and the switching device D11 may be horizontally apart from each other even if the interval w1 is zero. The intermediate electrode M11 may electrically connect the variable resistance layer R11 and the switching device D11, and may extend from the top surface of the variable resistance layer R11 to the bottom surface of the switching device D11.

The intermediate electrode M11 may have a shape overall parallel to the substrate (not shown). However, example embodiments are not limited thereto, and the shape of the intermediate electrode M11 may vary. Shapes of the variable resistance layer R11 and the switching device D11 may also vary. For example, although FIG. 1 shows that the variable resistance layer R11 is disposed at the intersection point of the first electrode E1 and the intermediate electrode M11, the variable resistance layer R11 may extend outward from the location at which the first electrode E1 and the intermediate electrode M11 cross each other. In example embodiments, the variable resistance layer R11 may be disposed on the entire bottom surface of the intermediate electrode M11.

However, only a region of the variable resistance layer R11 at the location where the first electrode E1 and the intermediate electrode M11 cross each other may be an effective variable resistance region, and other regions outside the location may be ineffective variable resistance regions. Therefore, even if the variable resistance layer R11 has a shape extending outward from the location at which the first electrode E1 and the intermediate electrode M11 cross each other, an effective region (see FIG. 3) of the variable resistance layer R11 and the switching device D11 may be horizontally apart from each other.

Although FIG. 1 shows that the variable resistance layer R11 and the switching device D11 are disposed apart from each other in the direction of the Y-axis, the variable resistance layer R11 and the switching device D11 may be disposed apart from each other in the direction of the X-axis. In example embodiments, the intermediate electrode M11 may have a shape extending in the direction of the X-axis, and the location of the second electrode E21 may also be changed. Locations of the variable resistance layer R11 and the switching device D11 may be switched.

The variable resistance layer R11 may be formed of a material having a variable resistance, e.g., a transition metal oxide (TMO). For example, the variable resistance layer R11 may be formed of at least one of Ni oxides, Cu oxides, Ti oxides, Co oxides, Hf oxides, Zr oxides, Zn oxides, W oxides, Nb oxides, TiNi oxides, LiNi oxides, Al oxides, InZn oxides, V oxides, SrZr oxides, SrTi oxides, Cr oxides, Fe oxides, Ta oxides, and compounds thereof. The switching device D11 may be a diode, a threshold switching device, or a varistor. If the switching device D11 is a diode, the diode may be one of a pn diode, a back-to-back pn diode, a Schottky diode, a back-to-back Schottky diode, a tunnel diode, a varactor diode, and a zener diode. For example, if the switching device D11 is a diode, the switching device D11 may have a bilayer structure including a p-type semiconductor layer and an n-type semiconductor layer.

The p-type semiconductor layer and the n-type semiconductor layer may be oxide layers. For example, the switching device D11 may have a structure in which a p-type oxide layer, e.g., a CuO layer, and an n-type oxide layer, e.g., an InZnO layer, are sequentially stacked on a structure in which a p-type oxide layer, e.g., a NiO layer, and a n-type oxide layer, e.g., a TiO$_2$ layer, are sequentially stacked. In case of a CuO layer, O$^{2-}$, which is not combined with Cu due to spontaneous Cu deficiency, may function as a donor, and thus, the CuO layer may become a p-type semiconductor layer. In case of an InZnO layer, Zn$^{2+}$, which either exists outside a lattice or is not combined with O due to spontaneous Zn interstitial and O vacancy, may function as an acceptor, and thus, the InZnO layer may become a n-type semiconductor layer.

Although the switching device D11 may be formed of amorphous oxide layers, which may be more easily formed at room temperature, example embodiments are not limited thereto, and the switching device D11 may also be formed of crystalline oxide layers. In case of a silicon diode, the silicon diode has to be manufactured at a relatively high temperature of about 800° C. Thus, choices of a substrate are limited, and various problems may occur due to the manufacturing operation at a relatively high temperature. Thus, forming the switching device D11 with an oxide layer that may be more easily formed at room temperature may be difficult. However, example embodiments are not limited thereto, and silicon may still be used to form the switching device D11. The switching device D11 may be formed of silicon or various other materials. The intermediate electrode M11 may be formed of materials generally used in semiconductor devices, and may be formed to have a single-layer structure or multi-layer structure.

Figure 2:
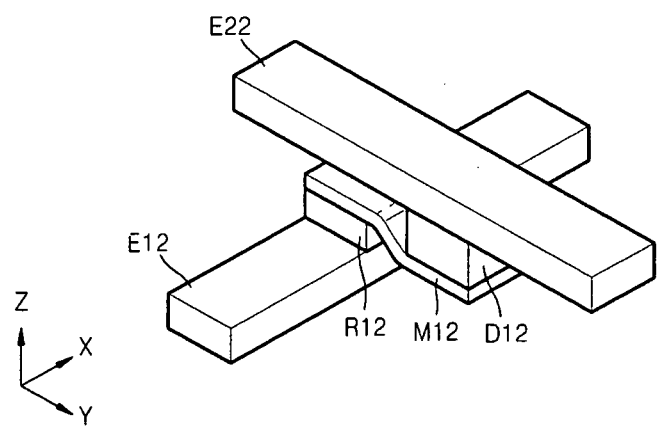

FIG. 2 is an oblique view of a resistive memory device according to example embodiments. Example embodiments illustrated in FIG. 2 are a modification of example embodiments illustrated in FIG. 1. Referring to FIG. 2, an intermediate electrode M12 may have a stepped portion between a variable resistance layer R12 and a switching device D12. The height of a portion of the intermediate electrode M12 on which the switching device D12 is formed may be lower than the height of a portion of the intermediate electrode M12 on which the variable resistance layer R12 is formed. Thus, the top surface of the switching device D12 of FIG. 2 may be located lower than the top surface of the switching device D11 of FIG. 1. At least a portion of the variable resistance layer R12 and at least a portion of the switching device D12 may overlap each other from a side viewpoint.

Accordingly, when the intermediate electrode M12 has a stepped portion, the height of a memory cell may be lowered, and thus, may be advantageous for improving integration. The intermediate electrode M12 is a modification of the intermediate electrode M11 of FIG. 1, and materials, structures, and shapes of a first electrode E12, the variable resistance layer R12, the switching device D12, and a second electrode E22 of FIG. 2 may correspond to those of the first electrode E11, the variable resistance layer R11, the switching device D11, and the second electrode E21 of FIG. 1.

Figure 3:
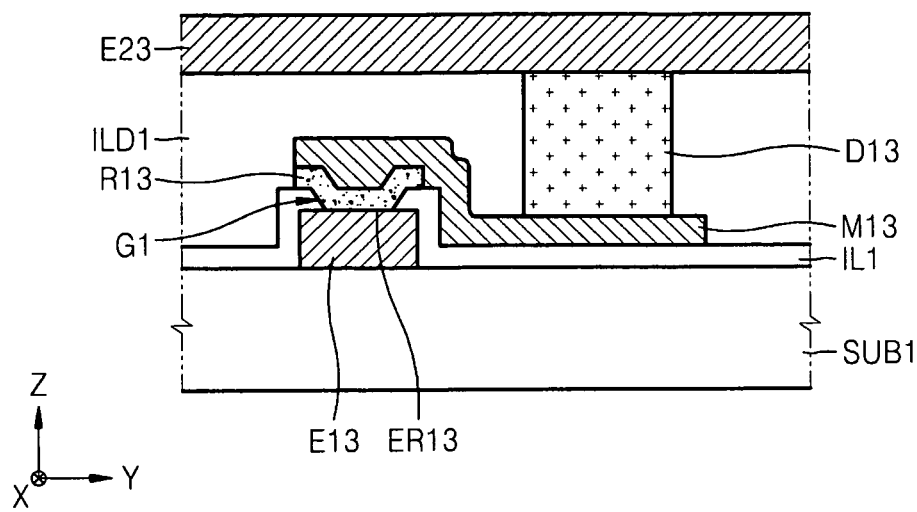

FIG. 3 is a sectional view of a resistive memory device according to example embodiments. Referring to FIG. 3, a first electrode E13 may be disposed on a substrate SUB1. The substrate SUB1 may be a glass substrate, a hard plastic substrate, a flexible plastic substrate, and/or a silicon substrate. The first electrode E13 may be formed by patterning a conductive layer in a predetermined or given shape, e.g., a linear shape. An insulation layer IL1 having a hole G1 partially exposing the top surface of the first electrode E13 may be disposed on the substrate SUB1 and the first electrode E13. The insulation layer IL1 may be formed of insulation materials, e.g., aluminum oxides, titanium oxides, silicon oxides, or silicon nitrides. The hole G1 may be formed by a sloped etching operation, and thus, the width of the hole G1 may decrease in a direction toward the first electrode E13.

The width of the hole G1 may not vary according to the height and may be constant. A variable resistance layer R13 contacting a region of the first electrode E13 exposed by the hole G1 may be disposed. The variable resistance layer R13 may extend onto a portion of the insulation layer IL1 surrounding the hole G1. Therefore, side surfaces of the variable resistance layer R13, that is, etched surfaces, may not contact the first electrode E13. An effective region ER13 actually contributing variable resistance characteristics in the variable resistance layer R13 is the region contacting the first electrode E13. The effective region ER13 of the variable resistance layer R13 and the switching device D13 may be horizontally apart from each other.

A region of the variable resistance layer R13 on the insulation layer IL1 does not contact the first electrode E13, and thus may be ineffective. Thus, even if the side surface of the variable resistance layer R13 is damaged by etching, variable resistance characteristics of the variable resistance layer R13 may not be deteriorated.

An intermediate electrode M13 contacting the variable resistance layer R13 may be disposed on the insulation layer IL1. The intermediate electrode M13 may have a shape extending from the top surface of the variable resistance layer R13 in a direction toward a side of the first electrode E13 (the direction of the Y-axis). Thus, the overall shape of the intermediate electrode M13 may be similar to that of the intermediate electrode M12 of FIG. 2. A switching device D13 may be disposed on one end of the intermediate electrode M13, the end apart from the variable resistance layer R13. Thus, the variable resistance layer R13 may be located horizontally apart from the switching device D13. An interlayer insulation layer ILD1, of which the overall height is the same as that of the switching device D13, may be formed on remaining regions of the intermediate electrode M13 other than the region in which the switching device D13 is disposed and on the insulation layer IL1.

A second electrode E23 contacting the switching device D13 may be disposed on the interlayer insulation layer ILD1. The second electrode E23 may be formed by patterning a conductive layer in a predetermined or given shape, e.g., a linear shape. The second electrode E23 may extend in a direction to cross the first electrode E13. The variable resistance layer R13 and the intermediate electrode M13 of FIG. 3 may be modifications of the variable resistance layer R11 and the intermediate electrode M11 of FIG. 1, respectively. Materials, structures, and shapes of the first electrode E13, the switching device D13, and the second electrode E23 of FIG. 3 may correspond to those of the first electrode E11, the switching device D11, and the second electrode E21 of FIG. 1, respectively.

The structure shown in FIG. 3 may be modified variously. For example, before the insulation layer IL1 is formed, a bottom insulation layer, of which the overall height is the same as that of the first electrode E13, may be formed on portions of the substrate SUB1 at two opposite sides of the first electrode E13, and the insulation layer IL1 may be formed on the bottom insulation layer and the first electrode E13. The variable resistance layer R13 may be formed to extend to the bottom of the switching device D13. Accordingly, if the bottom insulation layer is disposed on both sides of the first electrode E13 and the variable resistance layer R13 is extended to the bottom of the switching device D13, the intermediate electrode M13 may have a shape overall parallel to the substrate SUB1. If the switching device D13 is disposed on the first electrode E13, the intermediate electrode M13 may be disposed on the switching device D13, the variable resistance layer R13 may be disposed on the intermediate electrode M13, an insulation layer having a hole partially exposing the top surface of the intermediate electrode M13 may be formed on the intermediate electrode M13, and the variable resistance layer R13 may contact the exposed portion of intermediate electrode M13. Various modifications may be made.

Figure 4:
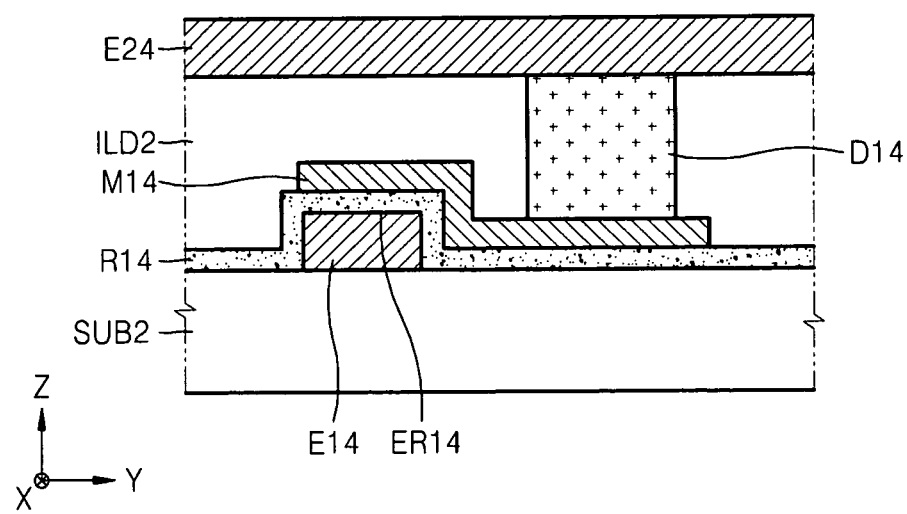

FIG. 4 is a sectional view of a resistive memory device according to example embodiments. Example embodiments illustrated in FIG. 4 are a modification of example embodiments illustrated in FIG. 3. Referring to FIG. 4, a first electrode E14 may be disposed on a substrate SUB2, and a variable resistance layer R14 may be disposed to cover the substrate SUB2 and the first electrode E14. An intermediate electrode M14 may be disposed on the variable resistance layer R14. The intermediate electrode M14 may have a shape extending from the top surface of the first electrode E14 in a direction toward a side of the first electrode E14. In a region of the variable resistance layer R14 contacting the first electrode E14, only a portion of the variable resistance layer R14 at a location where the first electrode E14 and the intermediate electrode M14 cross each other may be an effective variable resistance region ER14.

A switching device D14 may be disposed on one end of the intermediate electrode M14, the end apart from the first electrode E14. Thus, the variable resistance layer R14 may be horizontally apart from the switching device D14. As in FIG. 3, an interlayer insulation layer ILD2 and a second electrode E24 may be provided. The variable resistance layer R14 and the intermediate electrode M14 of FIG. 4 may be considered as modifications of the variable resistance layer R13 and the intermediate electrode M13 shown in FIG. 3, and materials, structures, and shapes of the substrate SUB2, the first electrode E14, the switching device D14, and the second electrode E24 of FIG. 4 may correspond to those of the substrate SUB1, the first electrode E13, the switching device D13, and the second electrode E23 of FIG. 3, respectively. In FIG. 4, a bottom insulation layer (not shown) may also be interposed between portions of the substrate SUB2 at two opposite sides of the first electrode E14 and the variable resistance layer R14, and the variable resistance layer R14 and the intermediate electrode R14 may be disposed parallel to the substrate SUB2.

Although not shown in FIGS. 1 through 4, third electrodes may further be disposed on the second electrodes E21 through E24, and a laminated structure, which includes a variable resistance layer, a switching device, and an intermediate electrode therebetween, may further be interposed between the second electrodes E21 through E24 and the third electrodes, wherein the laminated structure will be referred as a second laminated structure hereinafter. In the second laminated structure, the variable resistance layer and the switching device may be horizontally apart from each other, and the intermediate electrode may have either a straight shape overall parallel to a substrate or a curved shape having a stepped portion. The second laminated structure and the third electrodes will be described below in detail with reference to FIGS. 8 through 11.

Horizontal areas of the variable resistance layers R11 through R13 and the switching devices D11 through D13 in FIGS. 1 through 3, that is, sizes thereof, may be similar to one another when viewed from above. In FIG. 4, horizontal areas of effective variable resistance region of the variable resistance layers R14 and the switching device D14 may also be similar to one another. However, according to example embodiments, horizontal areas of effective variable resistance regions of the variable resistance layers R11 through R14 and the switching devices D11 through D14 may be different, as seen from a cross-sectional viewpoint. For example, the switching device D11 through D14 may be formed to be relatively larger than the effective variable resistance regions of the variable resistance regions R11 through R14.

Figure 10:
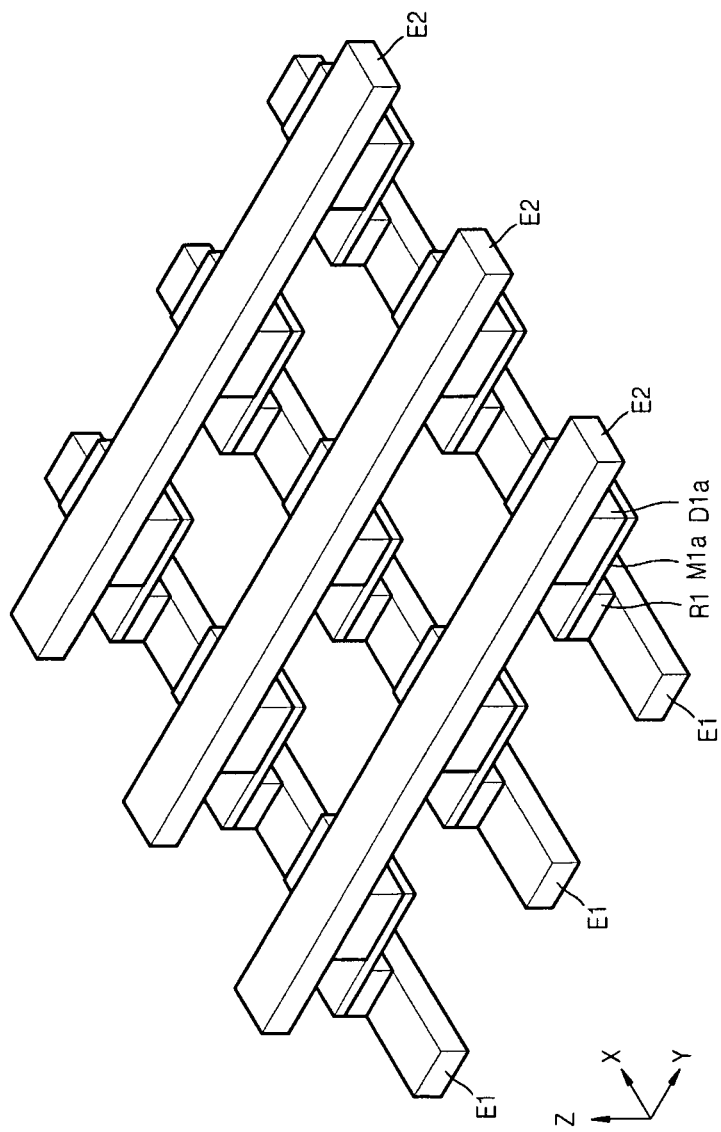

In example embodiments, the switching devices D11 through D14 may extend to the outside edges of the second electrodes E21 through E24, and ends of the intermediate electrodes M11 through M14 on which the switching devices D11 through D14 are formed may be formed larger than in example embodiments illustrated in FIG. 3. A contact electrode layer (not shown) covering the top surface of the switching devices D11 through D14 may further be interposed between the switching devices D11 through D14 and the second electrodes E21 through E24. Accordingly, if the switching devices D11 through D14 are formed to be relatively large sizes, forward currents of the switching devices D11 through D14 may increase and switching characteristics may be improved. FIG. 10 illustrates modified example embodiments in relation thereto. Detailed descriptions will be given below with reference to FIG. 10.

As described above, the effective variable resistance regions of the variable resistance layers R11 through R14 are horizontally apart from the switching devices D11 through D14 in FIGS. 1 through 4. Accordingly, if the variable resistance layers R11 through R14 and the switching devices D11 through D14 are formed to be apart from each other, deterioration of characteristics of the switching devices D11 through D14 may be controlled or prevented. If an effective variable resistance region of a variable resistance layer and a switching device (diode) is arranged on the same vertical line, characteristics, e.g., rectification characteristics, of the switching device (diode) may be more easily deteriorated.

More particularly, a reverse leakage current of the switching device (diode) may increase, and thus, a resistive memory device may have various adverse effects. However, as described in example embodiments, deterioration of characteristics of the switching devices D11 through D14 may be controlled or prevented by having the variable resistance layers R11 through R14 and the switching devices D11 through D14 located apart from each other.

Figure 5:
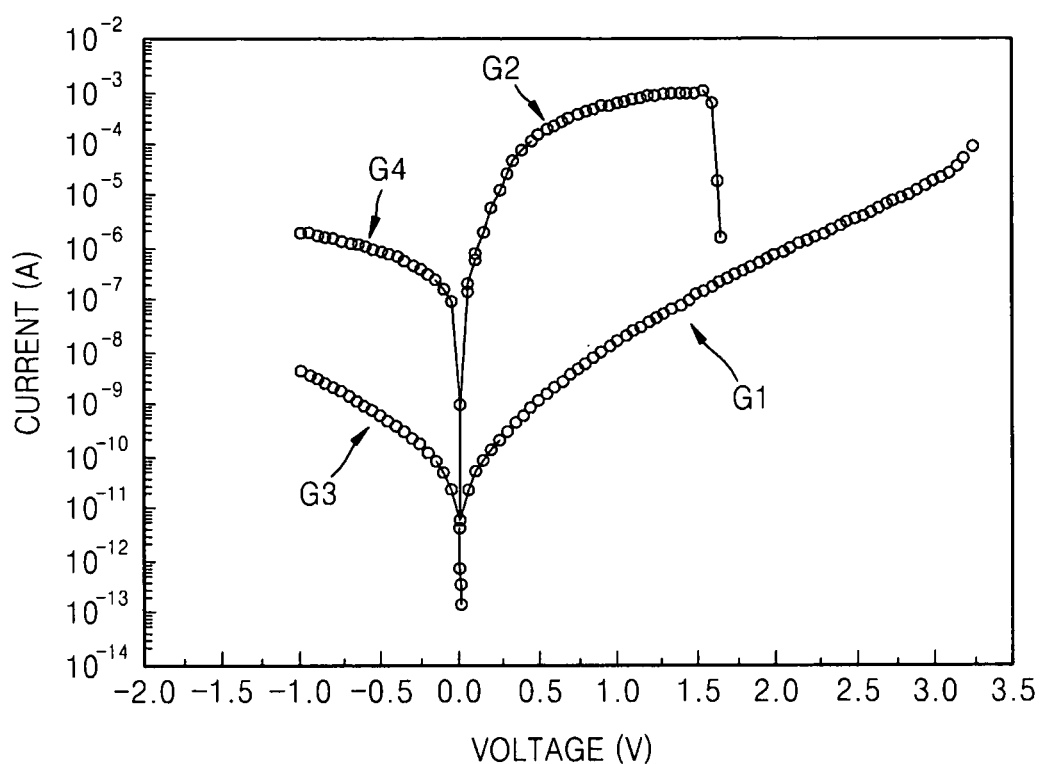
FIG. 5 is a graph showing voltage (V)-current (A) characteristics of a resistive memory device according to a comparative example of the conventional art.

FIG. 5 is a graph showing voltage (V)-current (A) characteristics of a resistive memory device according to a comparative example of the conventional art. The resistive memory device according to the comparative example has a structure in which the switching device D11 is located directly above the variable resistance layer R11. The intermediate electrode M11 has a horizontal structure the same as that of the variable resistance layer R11. In the comparative example, a Ni oxide layer is used as a variable resistance layer, a Pt layer is used as an intermediate electrode, and a diode in which a CuO layer and an IZO layer are stacked is used as a switching device.

In FIG. 5, first and second graphs G1 and G2 in the area of positive (+) voltages indicate characteristics of the variable resistance layer in OFF and ON states, respectively. Third and fourth graphs G3 and G4 in the area of negative (−) voltages indicate reverse characteristics of the diode before and after the variable resistance layer is programmed, respectively.

Referring to FIG. 5, the fourth graph G4 is located higher than the third graph G3. In other words, a reverse leakage current of the switching device (diode) increased after the variable resistance layer is programmed, and the rectification characteristics of the switching device (diode) are deteriorated. Accordingly, if the rectification characteristics of the switching device (diode) are deteriorated, a sensing margin may be decreased and a reproduction (reading) current may flow in an unwanted direction during an information reproduction (reading) operation of the resistive memory device.

Thus, a reading error may occur, and reliability of the resistive memory device may decrease. Because a sensing margin is not sufficiently large, disposing many memory cells on a single electrode line may be difficult, because the electrical resistance of an electrode line increases as the length of the electrode line increases, thereby sensing becomes harder. Thus, improving integration may be difficult when the resistive memory device according to the comparative example is to be fabricated in an array.

Figure 6:
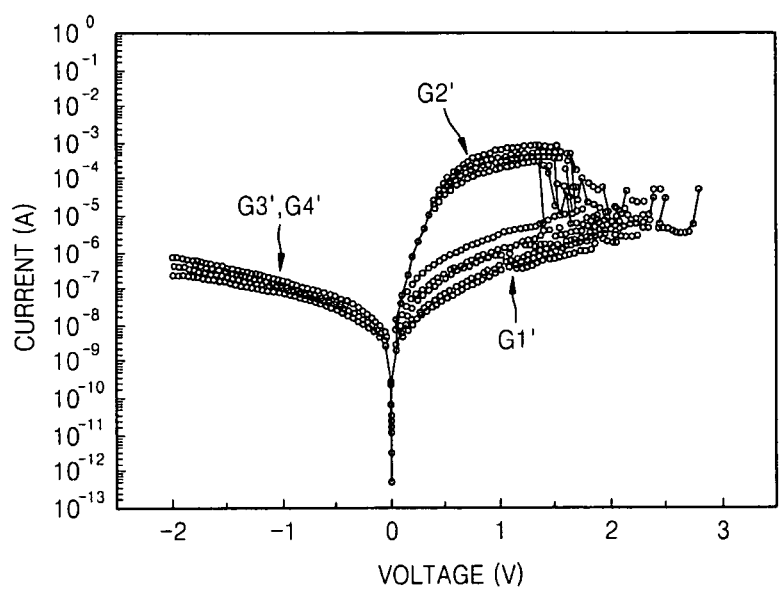

FIG. 6 is a graph showing voltage (V)-current (A) characteristics of a resistive memory device according to example embodiments as shown in FIG. 1. In example embodiments, Ni oxide layer may be used as the variable resistance layer R11, Pt layer may be used as the intermediate electrode M11, and a diode in which CuO layer and IZO layer are stacked may be used as the switching device D11. In other words, the resistive memory device of FIG. 6 is the same as the resistive memory device of FIG. 5, except that the variable resistance layer R11 and the switching device D11 are horizontally apart in the resistive memory device of FIG. 6.

In FIG. 6, first and second graphs G1' and G2' in the area of positive (+) voltages indicate characteristics of the variable resistance layer R11 in OFF and ON states, respectively. Third and fourth graphs G3' and G4' in the area of negative (−) voltages indicate reverse characteristics of the switching device (diode) D11 before and after the variable resistance layer R11 is programmed, respectively.

Referring to FIG. 6, locations of the third and fourth graphs G3' and G4' are almost the same and hard to distinguish. Thus, deterioration of rectification characteristics of the switching device D11 may be prevented or reduced if the variable resistance layer R11 and the switching device D11 are formed to be horizontally apart from each other as shown in FIG. 1. In other words, even after the variable resistance layer R11 is programmed, a reverse leakage current of the switching device D11 does not increase and may be maintained relatively low. Thus, a resistive memory device according to example embodiments may have a relatively large sensing margin. In a resistive memory device according to example embodiments, reproduction (reading) current flowing in an unwanted direction may be controlled or prevented. Thus, a reading error decreases, and reliability of the resistive memory device may be improved. Easier sensing may be possible even if many memory cells are disposed on a single electrode line, and thus the resistive memory device may be advantageous for improving integration thereof.

The structures shown in FIGS. 1 through 4 may be unitary cell structures of a resistive memory device according to example embodiments. A resistive memory device according to example embodiments may have an array structure which includes the structures shown in FIGS. 1 through 4 as unitary cell structures. Examples of the array structures are shown in FIGS. 7, 8, 10, and 11. Memory arrays shown in FIGS. 7, 8, 10, and 11 may be multi-layer cross-point resistive memory devices having an 1 switch (S)-1 resistor (R) cell structure, wherein the 1S-1R cell structure may be a 1 diode (D)-1R cell structure, for example.

Figure 7:
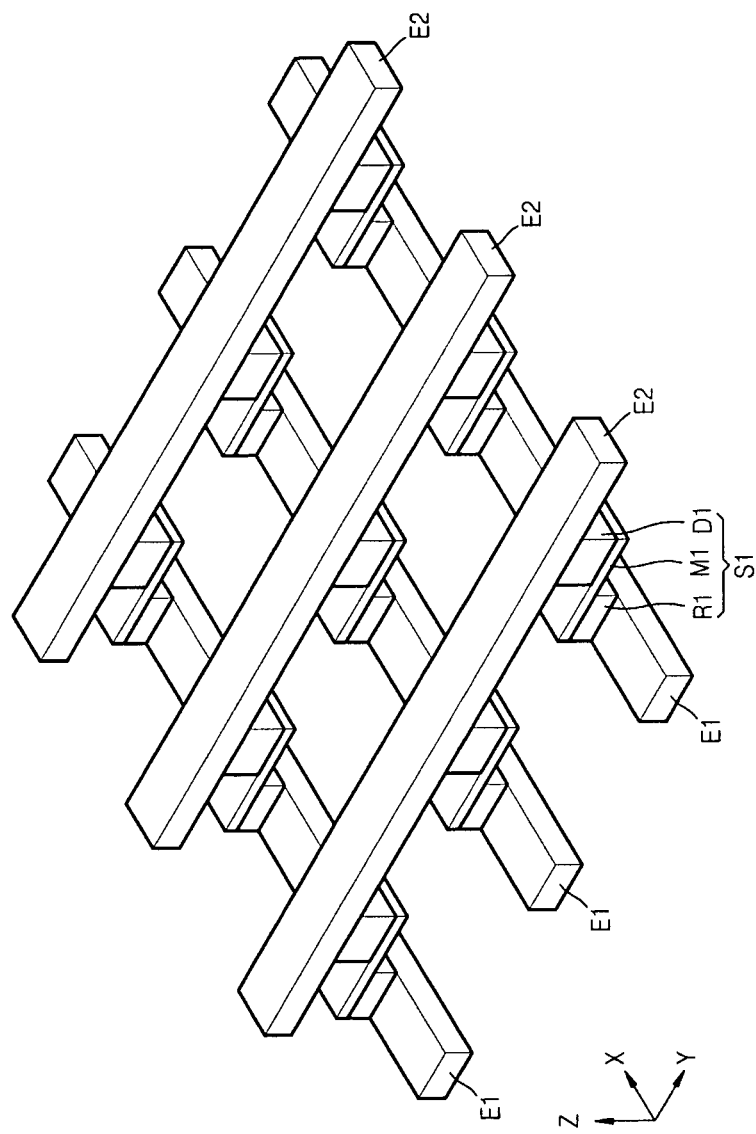

Referring to FIG. 7, a plurality of first electrodes E1 may be disposed on a substrate (not shown). The plurality of first electrodes E1 may have a shape of wirings extending in the direction of the X-axis, and may be a fixed interval apart from each others. A plurality of second electrodes E2, which are a predetermined or given interval apart from the top surfaces of the plurality of first electrodes E1, may be disposed on the plurality of first electrodes E1. The plurality of second electrodes E2 may have a shape of wirings extending in the direction of the Y-axis, and may be a fixed interval apart from each other. Each of the first electrodes E1 and the second electrodes E2 may respectively correspond to the first electrode E11 and the second electrode E21 of FIG. 1, and directions in which the first and second electrodes E1 and E2 extend may be switched.

A first laminated structure S1 may be disposed at the intersection point of the first electrode E1 and the second electrode E2. The first laminated structure S1 may include a first variable resistance layer R1, a first intermediate electrode M1, and a first switching device D1 that are sequentially stacked on the first electrode E1. The first laminated structure S1 may correspond to the first laminated structure S11 of FIG. 1. As with the structure shown in FIG. 1, the structure shown in FIG. 7 may be modified variously.

Figure 8:
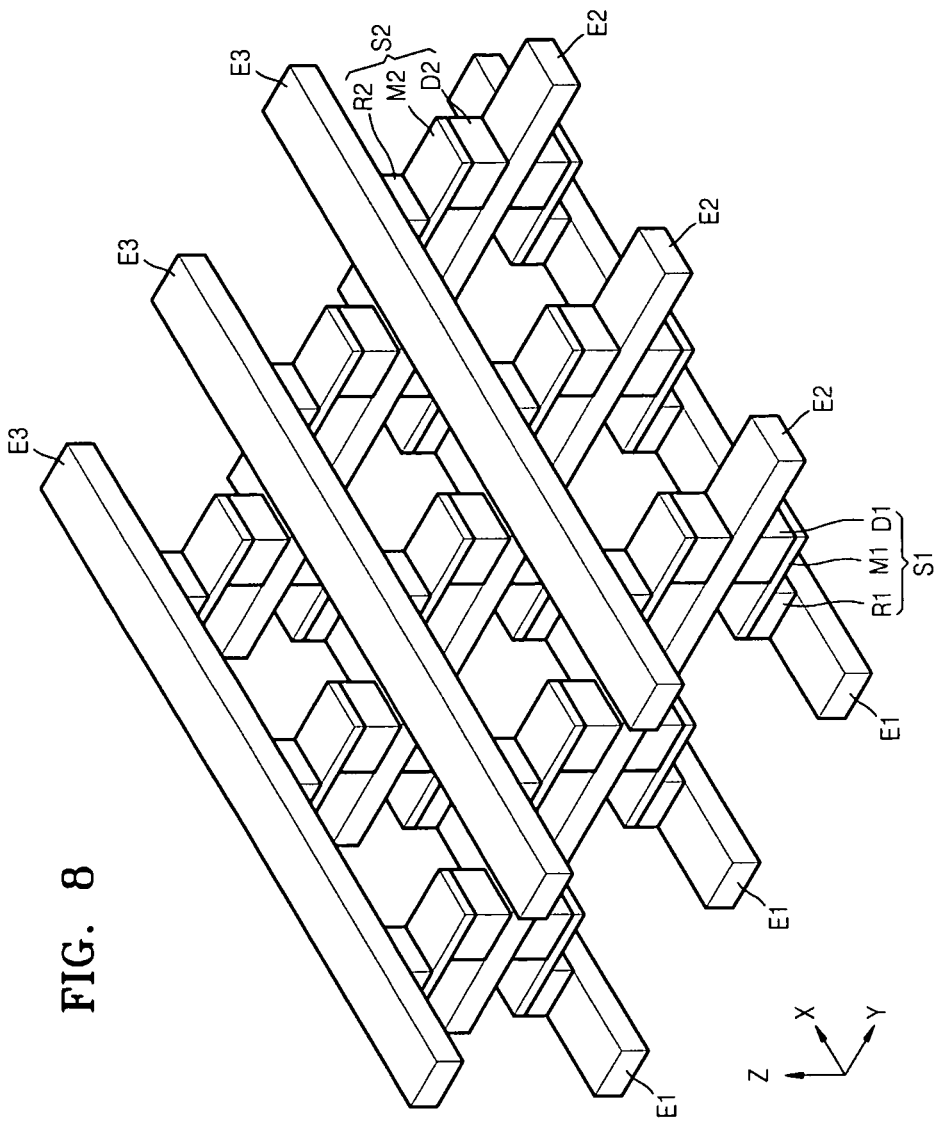

FIG. 8 is an oblique view of a resistive memory device according to example embodiments. Example embodiments illustrated in FIG. 8 are a modification of example embodiments illustrated in FIG. 7. The resistive memory device of FIG. 8 has a structure wherein third electrodes E3 and second laminated structures S2 are added to the structure shown in FIG. 7.

Referring to FIG. 8, a plurality of third electrodes E3, which are a predetermined or given interval apart from the plurality of second electrodes E2, may be disposed on the plurality of second electrodes E2. The plurality of third electrodes E3 may have a shape of wirings extending in the direction of the X-axis, and may be a fixed interval apart from each other. The third electrodes E3 may be disposed above the first electrodes E1, that is, above the first variable resistance layers R1. A second laminated structure S2 may be disposed at the intersection point of the second electrode E2 and the third electrode E3. The second laminated structure S2 may include a second switching device D2, a second intermediate electrode M2, and a second variable resistance layer R2 that are sequentially stacked. The second switching device D2 may be disposed on the second electrode E2 above the first switching device D1, and the second variable resistance layer R2 may be disposed on the rear surface of the third electrode E3 above the first variable resistance layer R1. The second intermediate electrode M2 may be interposed between the second switching device D2 and the second variable resistance layer R2 to interconnect them.

Figure 9A:
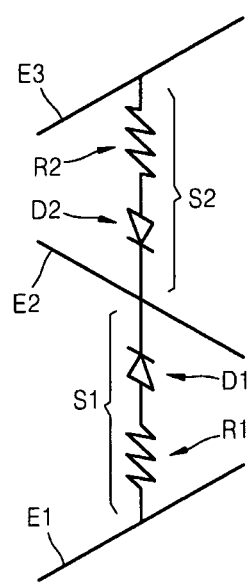
FIGS. 9A and 9B are circuit diagrams of resistive memory devices according to example embodiments.
Figure 9B:
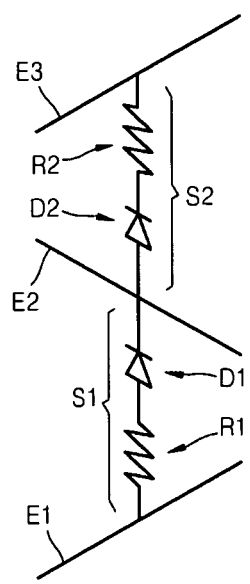

The second variable resistance layer R2 and the second intermediate electrode M2 may be formed of the same materials as the first variable resistance layer R1 and the first intermediate electrode M1, respectively. The second switching device D2 may have either the same stack structure as the first switching device D1 or a stack structure opposite from the stack structure of the switching device D1. Therefore, the first electrode E1, the first laminated structure S1, the second electrode E2, the second laminated structure S2, and the third electrode E3 may have circuit structures shown in FIG. 9A or FIG. 9B. In FIGS. 9A and 9B, the rectification directions of the first and second switching devices D1 and D2 may vary. In FIGS. 9A and 9B, locations of the first variable resistance layer R1 and the first switching device D1 may be switched, and locations of the second variable resistance layer R2 and the second switching device D2 may also be switched.

In the structure shown in FIG. 9A, the first and second switching devices D1 and D2 may be vertically symmetrical with respect to the second electrode E2, and thus, data may be simultaneously written to the first and second variable resistance layers R1 and R2 by using the second electrode E2 as a common bitline. Writing data to one of the first and second variable resistance layers R1 and R2 in an operation may be possible. That is, in FIG. 9A, the first and second variable resistance layers R1 and R2 may be programmed simultaneously or respectively. In the structure shown in FIG. 9B, directions of rectification of the first and second switching devices D1 and D2 are the same, and thus, data may be written to one of the first and second variable resistance layers R1 and R2 in a single programming operation.

Referring back to FIGS. 7 and 8, the first intermediate electrode M1 may be curved as the intermediate electrode M12 shown in FIG. 2. The second intermediate electrode M2 shown in FIG. 8 may also be curved as the intermediate electrode M12 shown in FIG. 2. In example embodiments, an end of the intermediate electrode M2 contacting the second variable resistance layer R2 may be lower than the other end of the intermediate electrode M2 contacting the second switching device D2. The second variable resistance layer R2 and the second switching device D2 may overlap at least partially from a side viewpoint. Accordingly, where at least one of the first and second intermediate electrodes M1 and M2 has a stepped portion, a unitary memory cell may occupy less space, and thus, may be advantageous for improving integration.

Although not shown in FIG. 8, a multi-layer cross-point resistive memory device according to example embodiments may further include a structure, which has the same structure as a stacked structure including the first laminated structure S1 and the second electrode E2 on the third electrode E3. A multi-layer cross-point resistive memory device according to example embodiments may further include at least one or more sets of structures, each of which has the same structure as a stacked structure including the first laminated structure S1, the second electrode E2, the second laminated structure S2 on the third electrode E3.

A multi-layer cross-point resistive memory device according to example embodiments may further include at least one or more sets of structures, each of which has the same structure as a stacked structure in which the first laminated structure S1, the second electrode E2, the second laminated structure S2 are sequentially stacked on the third electrode E3.

FIG. 10 is an oblique view of a resistive memory device according to example embodiments. Example embodiments illustrated in FIG. 10 are a modification of example embodiments illustrated in FIG. 7, wherein the first intermediate electrode M1 and the first switching device D1 are modified. Referring to FIG. 10, a horizontal area of a first switching device D1a may be relatively larger than that of the first variable resistance layer R1. A size of an end of a first intermediate electrode M1a on which the first switching device D1a is formed may be larger than a size of another end of the first intermediate electrode M1a on which the first variable resistance layer R1 is formed. In example embodiments, the first switching device D1a and the first intermediate electrode M1a may extend in a direction perpendicular to a side surface of the second electrode E2 (the direction of the X-axis).

In example embodiments, a contact electrode layer (not shown) completely covering the top surface of the first switching device D1a may further be interposed between the first switching device D1a and the second electrode E2. Accordingly, if the first switching device D1a is formed to be relatively large, forward current of the switching device D1a may increase and switching characteristics may be improved. The first and second switching devices D1 and D2 and the first and second intermediate electrodes M1 and M2 of FIG. 8 may have extended structures as the first switching device D1a and the first intermediate electrode M1a of FIG. 10.

Figure 11:
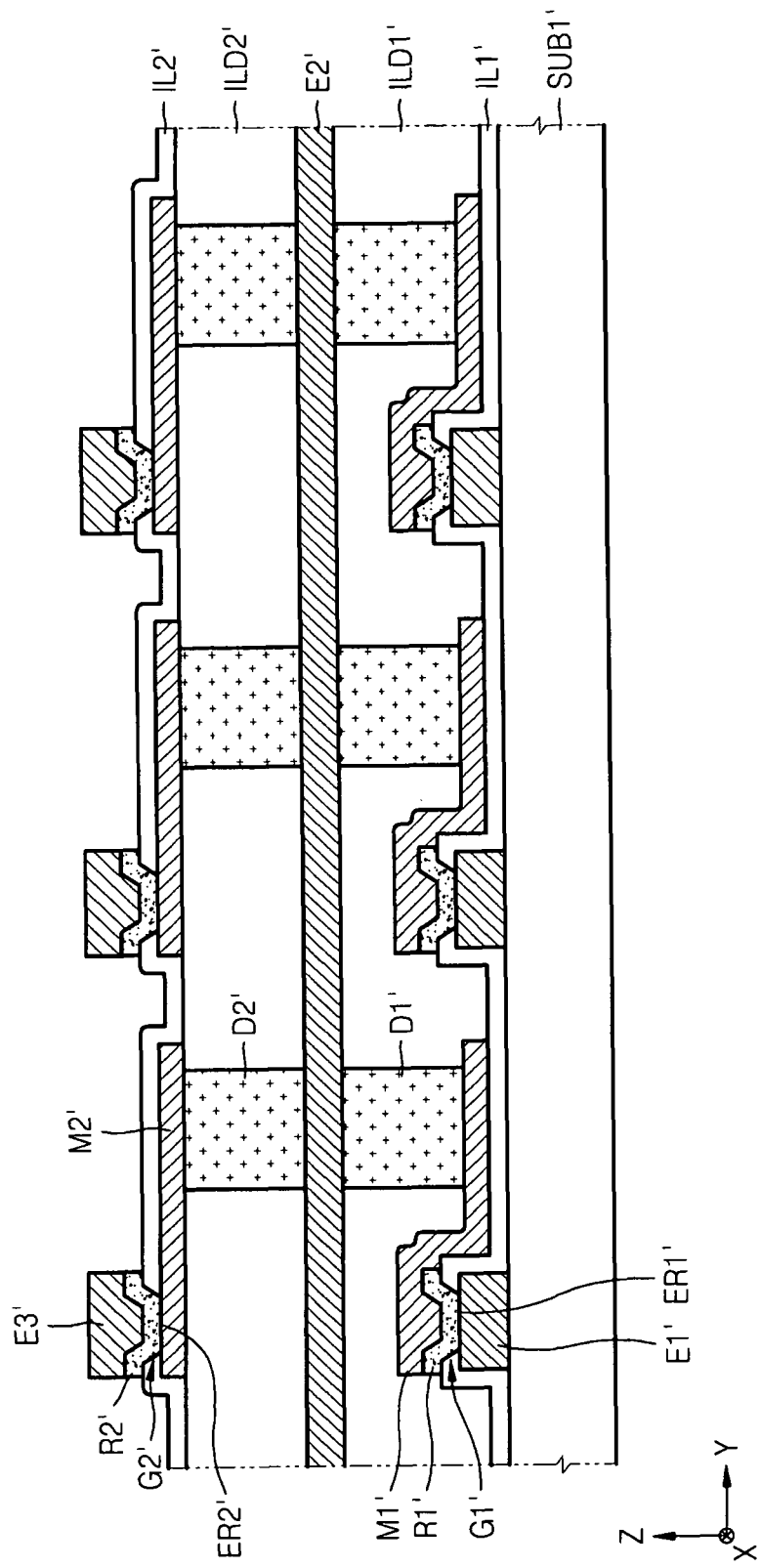

FIG. 11 is a sectional view of a resistive memory device having an array structure, according to example embodiments. Referring to FIG. 11, a plurality of first electrode E1' may be disposed on a substrate SUB1'. The first electrodes E1' may have a shape of wiring extending in a predetermined or given direction, e.g., the direction of the X-axis. A first insulation layer IL1' having a first hole G1' exposing a plurality of portions of each of the first electrodes E1' may be disposed on the substrate SUB1' and the plurality of first electrodes E1'. The first insulation layer IL1' may be a layer formed of insulation materials, e.g., aluminum oxides, titanium oxides, silicon oxides, or silicon nitrides.

A first variable resistance layer R1' contacting the exposed portions of each of the first electrodes E1' may be disposed. The first variable resistance layer R1' may have a shape extending onto the first insulation layer IL1' around the first holes G1'. A first intermediate electrode M1' contacting the first variable resistance layer R1' may be disposed on the first insulation layer IL1'. An effective region ER1' of the variable resistance layer R1' and the switching device D1' may be horizontally apart from each other.

The first intermediate electrode M1' may have a shape extending from the top surface of the first variable resistance layer R1' in a direction perpendicular to a side surface of the first electrode E1', e.g., the direction of the Y-axis.

A first switching device D1' may be disposed on an end of the first intermediate electrode M1', the end directly contacting the first insulation layer IL1'. A first interlayer insulation layer ILD1', of which the overall height is the same as that of the first switching device D1', may be disposed on the first intermediate electrode M1' and the first insulation layer IL1' around the first switching device D1'. A second electrode E2' contacting the first switching device D1' may be disposed on the first interlayer insulation layer ILD1'. The second electrode E2' may have a shape of wiring crossing the first electrode E1'. Although only one second electrode E2' is shown in FIG. 11, a plurality of second electrodes E2' may be disposed. The first electrode E1', the first insulation layer IL1', the first variable resistance layer R1', the first intermediate electrode M1', the first switching device D1', and the second electrode E2' may correspond to the first electrode E13, the insulation layer IL1, the variable resistance layer R13, the intermediate electrode M13, the switching device D13, and the second electrode E23 of FIG. 3, respectively.

A plurality of second switching devices D2' may be disposed on each of the second electrode E2'. The second switching devices D2' may be disposed above the first switching devices D1'. A second interlayer insulation layer ILD2' may be disposed on remaining portions of the second electrode E2' other than portions on which the second switching devices D2' are formed and on the first interlayer insulation layer ILD1'. The overall height of the second interlayer insulation layer ILD2' may be the same as that of the second switching devices D2'.

Second intermediate electrodes M2', each of which contacts each of the second switching devices D2', may be formed on the second interlayer insulation layer ILD2'. The second intermediate electrode M2' may have a shape extending from the top surface of the second switching device D2' in a direction perpendicular to a side surface of the second switching device D2', e.g., the reverse direction of the Y-axis. Therefore, the extended portion of the second intermediate electrode M2' may be located above the first electrode E1'.

A second insulation layer IL2' which covers the second intermediate electrode M2' but has a second hole G2' exposing the top surface of each of the second intermediate electrodes M2' may be disposed on the second interlayer insulation layer ILD2'. Second variable resistance layers R2' each of which contact exposed portions of each of the second intermediate electrodes M2' may be disposed. The second variable resistance layer R2' may have a shape extending onto the second insulation layer IL2' around the second hole G2'. An effective region ER2' of the variable resistance layer R1' and the switching device D1' may be horizontally apart from each other.

Third electrodes E3', each of which contacts each of the second variable resistance layers R2', may be disposed on the second variable resistance layers R2'. The third electrode E3' may have the shape of a wiring crossing the second electrode E2'.

At a point where the second intermediate electrode M2' and the third electrode E3' cross each other, only a portion of the second variable resistance layer R2' contacting the second intermediate electrode M2' is an effective variable resistance region, and thus, shapes of the second variable resistance layer R2' may vary. Therefore, the second variable resistance layer R2' may be patterned to have dot shapes or linear shapes, or may have a panel shape. If the second variable resistance layer R2' has a shape of linear patterns, the second variable resistance layer R2' may be patterned with the third electrode E3' such that the second variable resistance layer R2' may have a linear shape the same as that of the third electrode E3'.

In FIG. 11, a structure of a memory cell, including the second electrode E2', the second switching device D2', the second intermediate electrode M2', the second variable resistance layer R2', and the third electrode E3', may be a resistive memory device according to example embodiments by itself. In FIG. 11, materials of the second switching device D2', the second intermediate electrode M2', and the second variable resistance layer R2' may be the same as those of the second switching device D2, the second intermediate electrode M2, and the second variable resistance layer R2 shown in FIG. 8. The first electrode E1', the third electrode E3', and components therebetween may be the same as the circuit configurations shown in FIG. 9A or FIG. 9B.

Although FIG. 11 shows that the second intermediate electrode M2' has a straight shape and is parallel to the substrate SUB1', the second intermediate electrode M2' may be formed to have a curved shape with a stepped portion. To form the second intermediate electrode M2' in a curved shape with a stepped portion, a stepped portion may be in the second interlayer insulation layer ILD2' by partially recessing the second interlayer insulation layer ILD2', and the second intermediate electrode M2' may be formed in the stepped portion. In example embodiments, an end of the second intermediate electrode M2', the end on which the second variable resistance layer R2' is formed, may be located lower than the other end of the second intermediate electrode M2'. Accordingly, if the second intermediate electrode M2' is formed to have a curved shape, integration may be improved.

Although not shown, one or more sets of a stacked structure, which includes a variable resistance layer, an intermediate electrode, and a switching device, and an electrode contacting the stacked structure, may further be disposed on the third electrode E3' of FIG. 11. A memory array device, which has the structure shown in FIG. 4 as a unit cell structure, may also be embodied.

Resistive memory devices according to example embodiments described above may be used as rewritable memories or one-time programmable (OTP) memories. For example, in the case of having a first element in which the variable resistance layers R11 through R14, R1, R1', R2, and R2' are reversibly changed either from a higher resistance state to a lower resistance state or vice versa, a resistive memory device according to example embodiments may be a rewritable memory. Examples of the first elements may include a material layer having the characteristics of variable resistance described above and a filament fuse. In the case of having a second element in which the variable resistance layers R11 through R14, R1, R1', R2, and R2' are irreversibly changed from a higher resistance state to a lower resistance state, a memory cell programmed once may not be restored to its original state, and thus, a resistive memory device according to example embodiments may be an OTP memory. Examples of the second elements may include an antifuse, and the antifuse may be formed of dielectric materials, e.g., silicon oxide or silicon nitride.

It should be understood that example embodiments described therein should be considered in a descriptive sense only and not for purposes of limitation. Descriptions of features or aspects within each example embodiment should typically be considered as available for other similar features or aspects in other example embodiments. For example, one in the art should understand that the variable resistance layer R11 and the switching device D11 of FIG. 1 may partially overlap each other when viewed from above.

What is claimed is:

1. A resistive memory device comprising:
    a first electrode on a substrate;
    a second electrode apart from the first electrode; and
    a first laminated structure between the first and second electrodes including a first variable resistance layer, a first switching device, and a first intermediate electrode therebetween,
    wherein the first variable resistance layer includes a first variable resistance region, which is an effective variable resistance region,
    the first variable resistance region and the first switching device are horizontally apart from each other and not overlapped with each other, so that a reserve leakage current of the first switching device is decreased,
    the first intermediate electrode including a first portion extended parallel to the substrate, a second portion extended parallel to the first portion and a third portion connecting the first portion to the second portion, a lower surface and an upper surface of the first portion being horizontally apart from a lower surface and an upper surface of the second portion, and
    one of the first variable resistance region and the first switching device is between the first portion and the first electrode, and the other one of the first variable resistance region and the first switching device is between the second portion and the second electrode.

2. The resistive memory device of claim 1, wherein the first variable resistance region is between the first electrode and the first intermediate electrode, and the first switching device is between the first intermediate electrode and the second electrode.

3. The resistive memory device of claim 1, wherein the first switching device is between the first electrode and the first intermediate electrode, and
    the first variable resistance region is between the first intermediate electrode and the second electrode.

4. The resistive memory device of claim 2, further comprising:
    an insulation layer on the first electrode having a hole exposing a portion of the first electrode,
    wherein the first variable resistance layer contacts the portion of the first electrode exposed by the hole.

5. The resistive memory device of claim 3, further comprising:
    an insulation layer on the first intermediate electrode having a hole exposing a portion of the first intermediate electrode,
    wherein the first variable resistance layer contacts the portion of the first intermediate electrode exposed by the hole.

6. The resistive memory device of claim 1, wherein the first intermediate electrode either comprises a stepped portion or is parallel to the substrate, and,
    if the first intermediate electrode comprises a stepped portion, the first variable resistance region and the first switching device are on both ends of the stepped portion.

7. The resistive memory device of claim 1, wherein the first variable resistance layer includes a metal oxide.

8. The resistive memory device of claim 7, wherein the metal oxide includes at least one of Ni oxide, Cu oxide, Ti oxide, Co oxide, Hf oxide, Zr oxide, Zn oxide, W oxide, Nb oxide, TiNi oxide, LiNi oxide, Al oxide, InZn oxide, V oxide, SrZr oxide, SrTi oxide, Cr oxide, Fe oxide, Ta oxide, and compounds thereof.

9. The resistive memory device of claim 1, wherein a plurality of the first electrodes having a shape of a wiring are arranged parallel to each other,
    a plurality of the second electrodes having a shape of a wiring are arranged parallel to each other configured to cross the plurality of first electrodes, and
    the first laminated structure is on an intersection point of each of the plurality of first and second electrodes.

10. The resistive memory device of claim 1, further comprising:
    a third electrode separated in an upward vertical direction from the second electrode; and
    a second laminated structure between the second and third electrodes and including a second variable resistance layer, a second switching device, and a second intermediate electrode therebetween,
    wherein the second variable resistance layer includes a second variable resistance region, which is an effective variable resistance region, and
    the second variable resistance region and the second switching device are horizontally apart from each other.

11. The resistive memory device of claim 10, wherein the second switching device is between the second electrode and the second intermediate electrode, and
    the second variable resistance region is between the second intermediate electrode and the third electrode.

12. The resistive memory device of claim 11, wherein the second switching device is above the first switching device.

13. The resistive memory device of claim 10, wherein the second variable resistance region is between the second electrode and the second intermediate electrode, and the second switching device is between the second intermediate electrode and the third electrode.

14. The resistive memory device of claim 10, wherein the second intermediate electrode either comprises a stepped portion or is parallel to the substrate, and,
if the second intermediate electrode comprises a stepped portion, the second variable resistance region and the second switching device are on both ends of the stepped portion.

15. The resistive memory device of claim 10, wherein the second variable resistance layer is formed of the same material as the first variable resistance layer.

16. The resistive memory device of claim 10, wherein the second switching device is one from among a diode, a threshold switching device, and a varistor.

17. The resistive memory device of claim 16, wherein the second switching device is an oxide diode.

18. The resistive memory device of claim 10, wherein the first and second switching devices are diodes, and
directions of rectification of the first and second switching devices are either the same or opposite from each other.

19. The resistive memory device of claim 10, wherein a plurality of the second electrodes having a shape of a wiring are arranged parallel to each other,
a plurality of the third electrodes having a shape of a wiring are arranged parallel to each other to cross the plurality of second electrodes, and
the second laminated structure is on an intersection point of each of the plurality of second and third electrodes.

20. The resistive memory device of claim 19, wherein the resistive memory device is a multi-layer cross-point memory device having a 1S(switch)-1R(resistor) cell structure.

21. A resistive memory device comprising:
a first electrode;
a second electrode apart from the first electrode;
a first laminated structure between the first and second electrodes including a first variable resistance layer, a first switching device, and a first intermediate electrode therebetween, wherein the first variable resistance layer is between the first electrode and the first intermediate electrode, and the first switching device is between the first intermediate electrode and the second electrode; and
an insulation layer on the first electrode having a hole exposing a portion of the first electrode,
wherein the first variable resistance layer contacts the portion of the first electrode exposed by the hole,
wherein the first variable resistance layer includes a first variable resistance region that is an effective variable resistance region, and the first variable resistance region and the first switching device are horizontally apart from each other, and
wherein the first variable resistance layer is extended onto a portion of the insulation layer surrounding the hole.

22. A resistive memory device comprising:
a first electrode;
a second electrode apart from the first electrode;
a first laminated structure between the first and second electrodes including a first variable resistance layer, a first switching device, and a first intermediate electrode therebetween, wherein the first switching device is between the first electrode and the first intermediate electrode, and the first variable resistance layer is between the first intermediate electrode and the second electrode; and
an insulation layer on the first intermediate electrode having a hole exposing a portion of the first intermediate electrode,
wherein the first variable resistance layer contacts the portion of the first intermediate electrode exposed by the hole,
wherein the first variable resistance layer includes a first variable resistance region that is an effective variable resistance region, and the first variable resistance region and the first switching device are horizontally apart from each other, and
wherein the first variable resistance layer is extended onto a portion of the insulation layer surrounding the hole.

23. The resistive memory device of claim 1, wherein the first switching device is one from among a diode, a threshold switching device, and a varistor.

24. The resistive memory device of claim 23, wherein the first switching device is an oxide diode.

* * * * *